US009881738B2

United States Patent
Zang et al.

(10) Patent No.: US 9,881,738 B2
(45) Date of Patent: Jan. 30, 2018

(54) CAPACITOR STRUCTURES WITH EMBEDDED ELECTRODES AND FABRICATION METHODS THEREOF

(71) Applicant: GLOBALFOUNDRIES Inc., Grand Cayman (KY)

(72) Inventors: Hui Zang, Guilderland, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 162 days.

(21) Appl. No.: 14/818,342

(22) Filed: Aug. 5, 2015

(65) Prior Publication Data

US 2017/0040110 A1    Feb. 9, 2017

(51) Int. Cl.
*H01G 13/00* (2013.01)
*H01G 4/012* (2006.01)
*H01G 4/30* (2006.01)
*H01G 4/33* (2006.01)
*H01L 49/02* (2006.01)

(52) U.S. Cl.
CPC .............. *H01G 4/012* (2013.01); *H01G 4/306* (2013.01); *H01G 4/33* (2013.01); *H01L 28/82* (2013.01); *H01L 28/90* (2013.01)

(58) Field of Classification Search
CPC .............. A61K 31/713; C12N 15/1138; C12N 2310/14; C12N 2310/3513; C12N 2320/32
See application file for complete search history.

(56) References Cited

U.S. PATENT DOCUMENTS

| 6,967,138 B2 * | 11/2005 | Ding .................. H01L 21/4857 257/295 |
| 7,444,727 B2 * | 11/2008 | Savic ...................... H01G 4/12 29/25.03 |
| 8,552,812 B2 | 10/2013 | Yen et al. |

(Continued)

OTHER PUBLICATIONS

T. Charania et al., Analysis and Design of On-Chip Decoupling Capacitors, IEEE, VLST Systems, V. 21, No. 4, p. 648, 2013.

(Continued)

*Primary Examiner* — Minh Trinh
(74) *Attorney, Agent, or Firm* — Heslin Rothenberg Farley & Mesiti P.C.

(57) ABSTRACT

Capacitor structures having first electrodes at least partially embedded within a second electrode, and fabrication methods are presented. The methods include, for instance: providing the first electrodes at least partially within an insulator layer, the first electrodes comprising exposed portions; covering exposed portions of the first electrodes with a dielectric material; and forming the second electrode at least partially around the dielectric covered portions of the first electrodes, the second electrode being physically separated from the first electrodes by the dielectric material. In one embodiment, a method further includes exposing further portions of the first electrodes; and providing a contact structure in electrical contact with the further exposed portions of the first electrodes. In another embodiment, some of the first electrodes are aligned substantially parallel to a first direction and other of the first electrodes are aligned substantially parallel to a second direction, the first and second directions being different directions.

11 Claims, 8 Drawing Sheets

(56) References Cited

U.S. PATENT DOCUMENTS

| | | | |
|---|---|---|---|
| 2004/0164339 A1* | 8/2004 | Felsner | H01G 4/228 |
| | | | 257/307 |
| 2009/0097186 A1* | 4/2009 | Topaloglu | H01G 4/232 |
| | | | 361/306.3 |
| 2010/0125989 A1* | 5/2010 | Huang | H01G 4/33 |
| | | | 29/25.42 |
| 2012/0151726 A1* | 6/2012 | Chung | H01G 4/228 |
| | | | 29/25.41 |
| 2014/0104745 A1* | 4/2014 | Zheng | H01G 4/33 |
| | | | 361/275.1 |
| 2017/0040110 A1* | 2/2017 | Zang | H01G 4/012 |

OTHER PUBLICATIONS

P.Y. Chiu, M.D. Ker, Metal-Layer Cap in 65nm CMOS for Low-Leakage Power-Rail ESD Clamp Circuit, Microelectronics Reliability 54, pp. 64-70, 2014.

* cited by examiner

CAPACITOR STRUCTURES WITH EMBEDDED ELECTRODES AND FABRICATION METHODS THEREOF

FIELD OF THE INVENTION

The present invention relates to electrical devices and methods of fabricating electrical devices, and more particularly to capacitor structures with embedded electrodes and fabrication methods thereof.

BACKGROUND

The electronics industry continues to pursue integrated circuits with enhanced performance and increased density to meet consumer demand. Capacitors are key required devices for the fabrication of integrated circuits. Typically, a capacitor includes two electrodes separated by a dielectric material, e.g., a parallel plate capacitor.

As semiconductor device critical dimensions have been reduced in order to increase the density of integrated circuits, traditional capacitor designs have exhibited scaling problems. These scaling problems include, for example, increases in resistance and leakage currents, and reductions in capacitance and fabrication yield.

For instance, reducing the size of a capacitor leads to a reduction in the amount of conductive material used in the capacitor and associated contact structures, increasing the resistance of the capacitor. In addition, the reduction in size (i.e., area) leads to a smaller capacitance of the capacitor.

In an effort to address these scaling problems, other capacitor designs have been introduced, such as metal-insulator-metal (MIM) capacitors and metal-oxide-metal (MOM) capacitors. These other designs can be rather complex and can require additional masking steps, leading to reduced fabrication yield and increased fabrication costs, respectively.

BRIEF SUMMARY

The shortcomings of the prior art are overcome, and additional advantages are provided, through the provision, in one aspect, of a method for fabricating a capacitor structure having first electrodes at least partially embedded within a second electrode. The method includes: providing the first electrodes at least partially within an insulator layer above a substrate, the first electrodes including exposed portions; covering exposed portions of the first electrodes with a dielectric material; and forming the second electrode at least partially around the dielectric covered portions of the first electrodes, the second electrode being physically separated from the first electrodes by the dielectric material.

In another aspect, a capacitor structure is presented. The capacitor structure includes: first electrodes disposed at least partially within an insulator layer above a substrate; a dielectric material covering portions of the first electrodes; and a second electrode disposed at least partially around the dielectric covered portions of the first electrodes, the second electrode being physically separated from the first electrodes by the dielectric material, and the first electrodes being at least partially embedded within the second electrode.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, three-dimensional capacitor structures and methods for fabricating three-dimensional capacitor structures, for example, in which first electrodes of a capacitor structure are embedded within a second electrode of the capacitor structure. The requirements of nanoscale integrated circuits have greatly reduced the available wafer surface area allotted to a given device. The present disclosure provides techniques to form three-dimensional capacitor structures, which can pack enhanced performance into the smaller allotted surface area or footprint of a wafer by making use of the third dimension normal to the surface of the wafer.

Advantageously, the present disclosure provides capacitor structures with increased capacitance, reduced resistance, greater fabrication yield, and reduced footprint and fabrication costs. For instance, a capacitor having multiple first electrodes, each surrounded by a dielectric material, allows for a greater interface area of dielectric material to electrode material in a given volume, as compared to a capacitor having a single first electrode. In addition, embedding multiple first electrodes within at least one second electrode, allows for a reduced resistance of the capacitor, as compared to connecting a number of separate capacitors in a circuit. Further, by fabricating such a capacitor in a way that minimizes photolithographic mask steps, and eliminates defect-prone fabrication steps, fabrication costs may be reduced and yield may be increased.

Generally stated, provided herein, in one aspect, is a capacitor structure. The capacitor structure includes: first electrodes disposed at least partially within an insulator layer; a dielectric material covering portions of the first electrodes; and a second electrode disposed at least partially around the dielectric covered portions of the first electrodes, the second electrode being physically separated from the first electrodes by the dielectric material, and the first electrodes being at least partially embedded within the second electrode.

In one embodiment, the capacitor structure further includes a contact structure, the contact structure being in electrical contact with other portions of the first electrodes. In another embodiment, the capacitor structure further includes a liner material, the liner material being disposed over the dielectric covered portions of the first electrodes and inhibiting damage to the dielectric material from the second electrode. In a further embodiment, some of the first electrodes are aligned substantially parallel to a first direction and other of the first electrodes are aligned substantially parallel to a second direction, the first and second directions being different directions.

In one example, the first electrodes include multiple stacked layers of electrodes. In another example, the first electrodes are spaced apart with a characteristic spacing. In another example, the first electrodes are aligned substantially parallel and coplanar. In a further example, the capacitor structure further includes a contact structure, the contact structure being in electrical contact with the second electrode or the multiple stacked layers of the first electrode.

Reference is made below to the drawings, which are not drawn to scale for ease of understanding, wherein the same reference numbers used throughout different figures designate the same or similar components.

Figure 1:
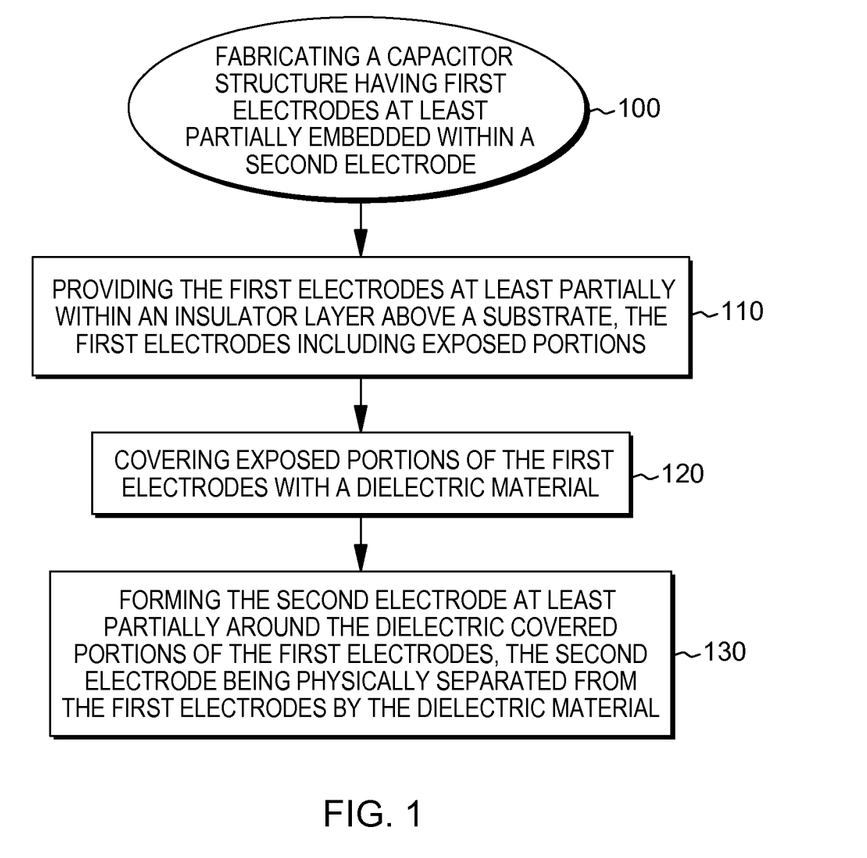
FIG. 1 depicts embodiments of a process for fabricating a capacitor structure, in accordance with one or more aspects of the present invention.

FIG. 1 depicts embodiments of a process for fabricating a capacitor structure, in accordance with one or more aspects of the present invention.

The fabricating 100 of a capacitor structure having a first electrode partially embedded within a second electrode includes, for instance: providing 110 the first electrodes at least partially within an insulator layer; covering 120 exposed portions of the first electrodes with a dielectric material; and forming 130 the second electrode at least partially around the dielectric covered portions of the first electrodes, the second electrode being physically separated from the first electrodes by the dielectric material.

In one embodiment, the fabricating 100 further includes: exposing further portions of the first electrodes; and providing a contact structure in electrical contact with the further exposed portions of the first electrodes. In another embodiment, the providing 110 includes forming the first electrodes within a cavity of the insulator layer, where the exposed portions of the first electrodes are exposed within the cavity of the insulator layer. In a further embodiment, the forming 130 includes filling the cavity of the insulator layer with the second electrode.

In one embodiment, the providing 110 includes removing portions of the insulator layer to form the cavity and expose portions of the first electrodes. In another embodiment, the providing 110 includes: forming trenches in the insulator layer; forming the first electrodes within the trenches of the insulator layer; and etching the insulator layer to expose portions of the first electrodes. In such a case, for example, the etching may include laterally etching the insulator layer to facilitate exposing lower portions of the first electrodes.

In a further embodiment, the fabricating 100 further includes disposing, after the covering, a liner material over the dielectric covered portions of the first electrodes, the liner material inhibiting damage to the dielectric material during the forming.

In one embodiment, the providing 110 includes aligning some of the first electrodes substantially parallel to a first direction and other of the first electrodes substantially parallel to a second direction, where the first and second directions are different directions. In another embodiment, the providing 110 includes stacking the first electrodes in multiple layers over the insulator layer. In another embodiment, the providing 110 includes spacing apart the first electrodes with a characteristic spacing, e.g., equal or variable lateral or vertical spacings. In a further embodiment, the providing 110 includes aligning the first electrodes to be substantially parallel and coplanar.

Figure 2A:
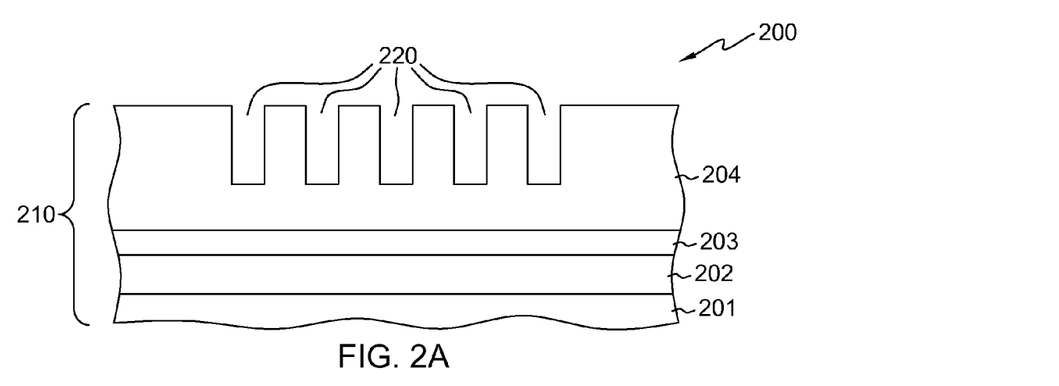
FIG. 2A is a cross-sectional elevational view of a structure found in a capacitor structure fabrication process, in accordance with one or more aspects of the present invention.

FIG. 2A is a cross-sectional elevational view of a structure 200 found in a capacitor structure fabrication process, in accordance with one or more aspects of the present invention.

By way of explanation, in a semiconductor fabrication process, semiconductor devices may be formed within a first (lower level) over a substrate in a front-end-of-line (FEOL) process. Next, the formed semiconductor devices may be connected using a series of metallization layers (referred to as back-end-of-line (BEOL) interconnections), labeled, for example, M1, M2 . . . M9, M10, and so forth. Each metallization layer includes a series of conductive connective lines that form connections between the elements of the layer below, such as devices or contact areas. As each metallization layer is formed, connections between metallization layers may be formed by using vias, which are vertical contact structures that extend from one metallization layer to another, or from the device layer to a metallization layer, and may be labeled as V0, V1, V2 . . . V8, V9, V10, and so forth. For example, each metallization layer and each via level may be formed using photolithographic patterning, masking, and etching techniques, by the use of an appropriate set of masks.

In the embodiment of FIG. 2A, structure 200 includes a circuit structure 210 and trenches 220, and circuit structure 210 includes multiple layers. In one embodiment, the capacitor structures described herein are formed near the BEOL processes, e.g., during formation of M1 and M10 metallization layers. In such a case, semiconductor devices such as transistors will be formed from the semiconductor substrate and will reside below the formed capacitor structures. For ease of illustration, such underlying semiconductor devices are not depicted herein, and structure 200 may include numerous such layers below the illustrated cutaway portion.

FIGS. 2A-2E describe one or more embodiments of a process for providing a capacitor, which may be carried out, in one example, using processes for forming metallization layers and vias, without introducing additional process or mask steps. Advantageously, integrated devices as described herein may therefore be fabricated with little or no additional processing steps, allowing for elimination of process steps previously used to form capacitors and/or inductors. In one example, trenches 220 may be formed using a masking step used for the formation of an M1 metallization layer. In another example, an integrated device as described herein may be formed concurrent with the formation of metallization layers and vias for connecting semiconductor devices.

In the illustrated embodiment, circuit structure 210 includes multiple (optional) layers. In the illustrated embodiment, circuit structure 210 includes a semiconductor substrate 201, a passivation layer 202, and an insulator layer 204. In one embodiment, trenches 220 may be formed by photolithographic masking of structure 200 followed by etching of insulator layer 204, such as anisotropic or directional etching.

In one or more embodiments, substrate 201 can be a bulk semiconductor material such as a bulk silicon wafer. In another embodiment, substrate 210 can include silicon (Si), single crystal Si, polycrystalline Si, amorphous Si, Si-on-nothing (SON), Si-on-insulator (SOI), or Si-on-replacement insulator (SRI). In a further embodiment, substrate 201 can be n-type or p-type doped. In such a case, substrate 201 may be doped, or various regions may be n-type and p-type doped to form various n-wells and p-wells. In one particular example, substrate 201 can have a thickness of less than or equal to 0.1 micrometers. In one example, passivation layer 202 may be or include silicon nitride. In another example, insulator layer 204 may be or include tetraethyl orthosilicate (TEOS).

Figure 2B:
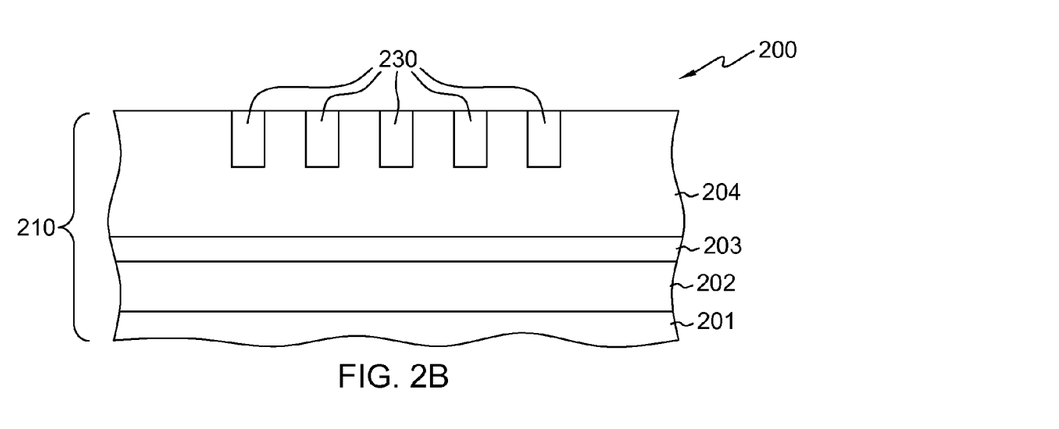
FIG. 2B depicts the structure of FIG. 2A, after forming first electrodes within trenches of an insulator layer, in accordance with one or more aspects of the present invention.

FIG. 2B depicts structure 200, after forming first electrodes 230 within trenches 220 of insulator layer 204, in accordance with one or more aspects of the present invention. In the illustrated embodiment, an isolation material has been (optionally) provided in the bottoms of trenches 220 (FIG. 2A) before forming first electrodes 230, and may be used to assist in a subsequent etching process steps described herein.

In one embodiment, first electrodes may be or include copper, or any suitable conductive material or metal, and any suitable deposition process may be employed. For example, first electrodes 230 may be formed by filling structure 200 with an electrode material, followed by chemical mechanical planarization (CMP) of the surface so that first electrodes 230 have the desirable size and height depicted in FIG. 2B.

In one example, the first electrodes may be spaced apart with a characteristic equal or variable spacing. In another example, the first electrodes may be aligned to be substantially parallel and coplanar. In other example, the first electrodes may be arranged in other manners, such as perpendicular to each other, in a random arrangement, etc.

Figure 2C:
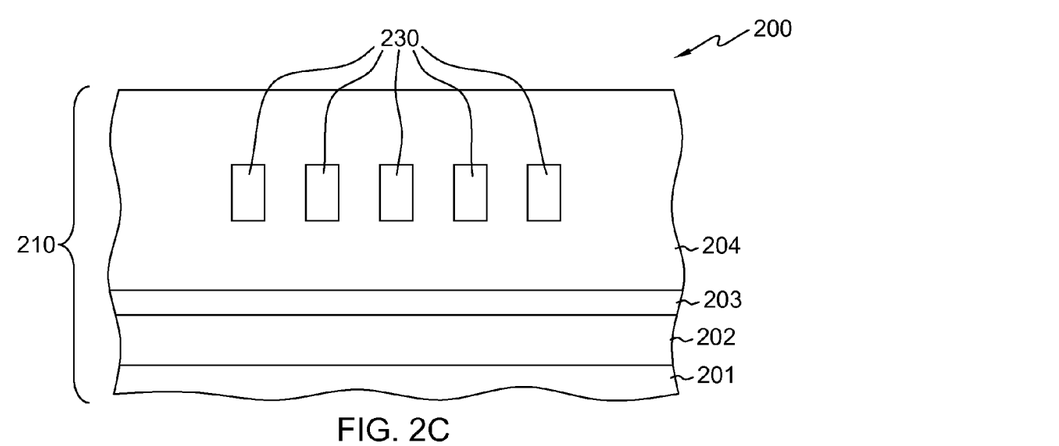
FIG. 2C depicts the structure of FIG. 2B, after deposition of an insulator layer over the first electrodes, in accordance with one or more aspects of the present invention.

FIG. 2C depicts structure 200, after deposition of insulator layer 204 over first electrodes 230, in accordance with one or more aspects of the present invention. For example, insulator layer 204, which may be or include TEOS, may be extended by depositing further insulator layer material over structure 200.

In one or more embodiments, insulator layer 204 is extended over first electrodes 230 so that first electrodes 230 are disposed completely within the insulator layer, to facilitate subsequent processing steps to expose some portions of first electrodes 230, as explained herein.

Figure 2D:
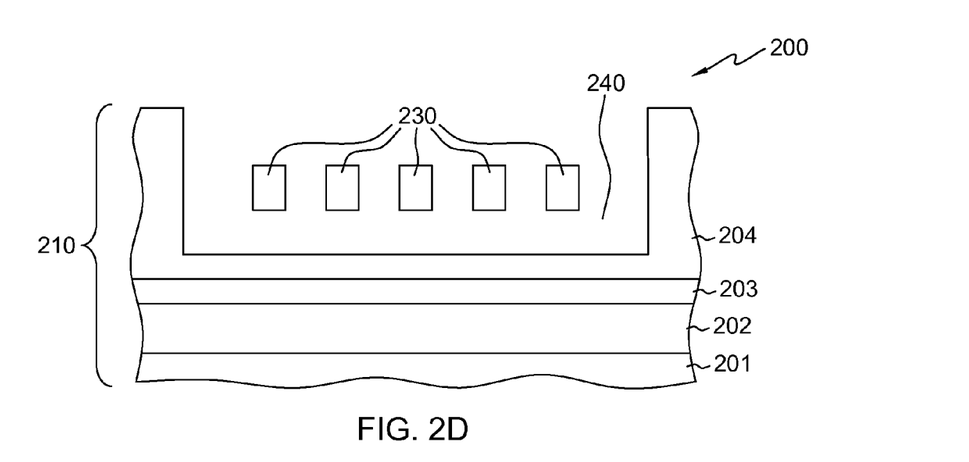
FIG. 2D depicts the structure of FIG. 2C, after removing portions of the insulator layer to form a cavity and expose portions of the first electrodes, in accordance with one or more aspects of the present invention.
Figure 2E:
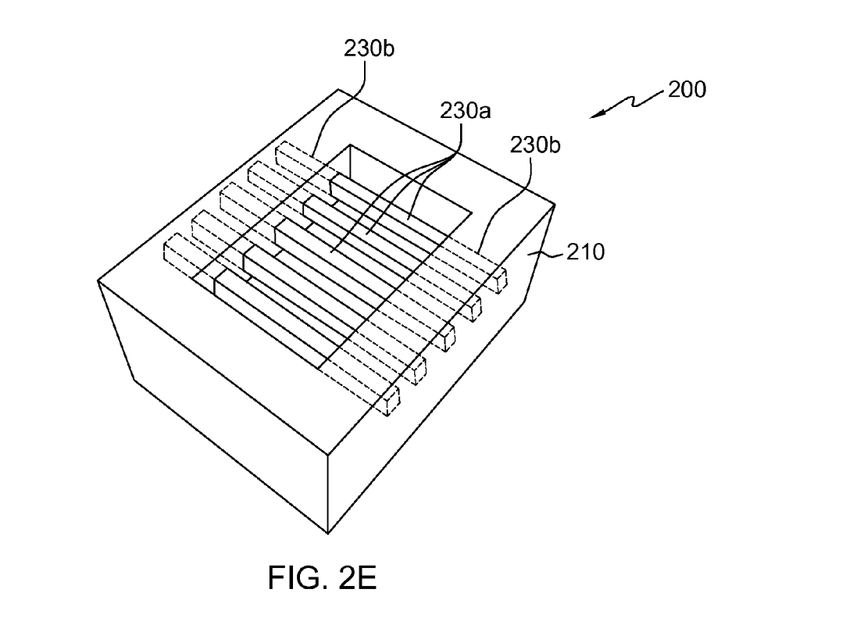
FIG. 2E is an isometric view of the structure of FIG. 2D, in accordance with one or more aspects of the present invention.

FIGS. 2D & 2E depict structure 200, after removing portions of insulator layer 204 to form a cavity 240 and expose portions of first electrodes 230, in accordance with one or more aspects of the present invention.

In one embodiment, insulator layer 204 may be masked and etched to expose portions of first electrodes 230, using, for example one or more of isotropic and anisotropic etching. In such a case, for example, the etching may include laterally etching insulator layer 204 to facilitate exposing lower portions of first electrodes 230. For instance, an isolation material below first electrodes 230 may have a greater etching rate than the material of insulator layer 204, and its presence can facilitate the lateral etching so that the bottoms of first electrode 230 are completely exposed.

As illustrated in FIG. 2E, after the removing, portions 230a of first electrodes 230 are formed and exposed in cavity 240, and other portions 230b of first electrodes 230 are not exposed, and remain embedded within insulator layer 204.

In addition, in the embodiment of FIG. 2D, first electrodes 230 may be seen as being substantially parallel and coplanar.

Figure 2F:
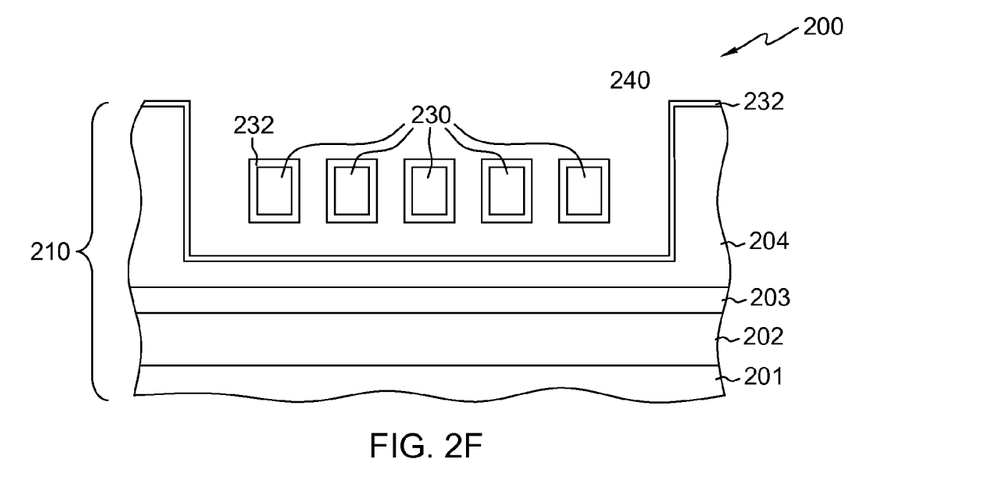
FIG. 2F depicts the structure of FIG. 2E, after covering the exposed portions of the first electrodes with a dielectric material, in accordance with one or more aspects of the present invention.

FIG. 2F depicts structure 200, after covering exposed portions (i.e., portions 230a of FIG. 2E) of first electrodes 230 with a dielectric material 232, in accordance with one or more aspects of the present invention. For example, dielectric material 232 may be a high dielectric constant (high-k) material having a dielectric constant greater than, for example, approximately 3.9 (the dielectric constant of silicon dioxide), including, but not limited to one or more of hafnium oxide, tantalum oxide, zirconium oxide, titanium oxide, or aluminum oxide. Any suitable deposition process, such as chemical vapor deposition (CVD) or atomic layer deposition (ALD) may be used to cover, coat, or cause to be deposited, the exposed portions of first electrode 230 with dielectric material 232.

In one embodiment, a liner material (not shown for simplicity) may be deposited over dielectric material 232. For example, the liner material may be titanium nitride. In one example, the liner material may be used to inhibiting damage to dielectric material during subsequent processing steps described herein. In another example, the liner material may be used to encourage (e.g., as a seed material) uniform deposition of an electrode material over first electrodes 230.

Figure 2G:
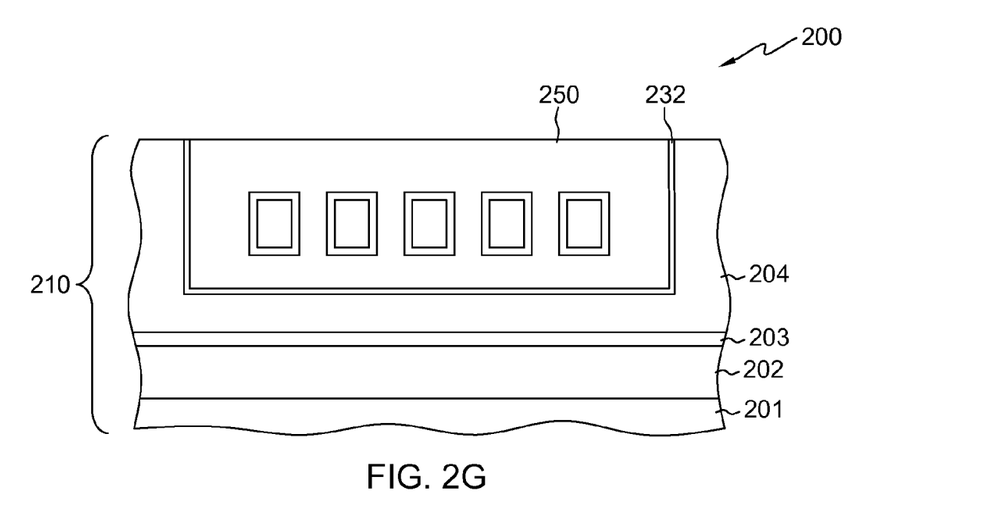
FIG. 2G depicts the structure of FIG. 2F, after forming a second electrode of the capacitor structure, in accordance with one or more aspects of the present invention.
Figure 2H:
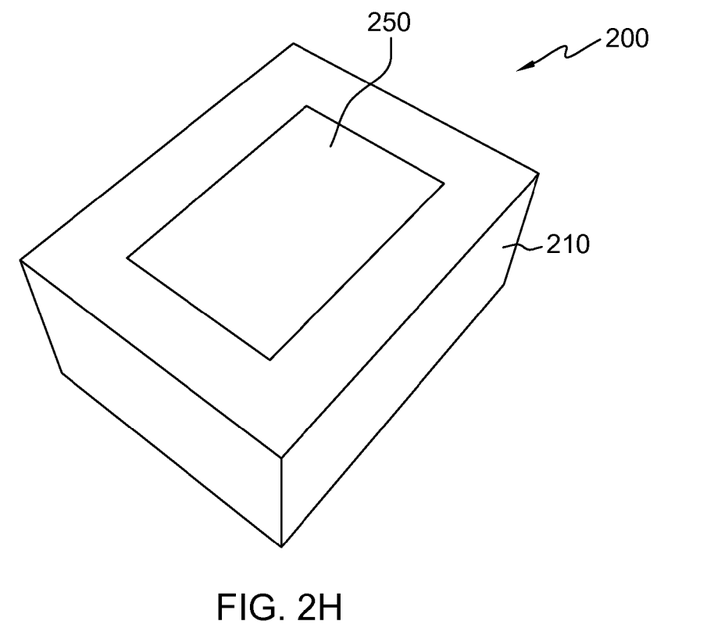
FIG. 2H is an isometric view of the structure of FIG. 2G, in accordance with one or more aspects of the present invention.

FIGS. 2G-2H depicts structure 200, after forming a second electrode 250 of the capacitor structure, in accordance with one or more aspects of the present invention.

In one embodiment, a conductive material, such as copper, may be deposited within cavity 240 (FIG. 2F) to form second electrode 250. In another embodiment, cavity 240 may be completely filled to overflowing with a conductive material, and a subsequent CMP or other planarizing processing step may be used to remove excess portions of second electrode 250.

In the illustrated embodiment, middle portions 230a (FIG. 2E) of first electrodes 230 are completely embedded within second electrode 250. For example, as depicted in the isometric view of FIG. 2H, second electrode 250 is situated for direct contact with a contact structure, however further portions (i.e., portions 230b of FIG. 2E) of first electrode 230 remain embedded within insulator layer 204.

In one or more embodiments, electrical contact with end portions 230b (FIG. 2E) of first electrodes 230 may be achieved. For example, end portions 230b of first electrodes 230 may be exposed by etching insulator layer 204 of structure 200 without etching second electrode 250. In one embodiment, second electrode 250 may itself be a mask for etching structure 200 to only reveal portions 230b of first electrodes 230, using any suitable selective etching process.

In one or more embodiments, contact structure may then be provided in electrical contact with portions 230b of first electrodes 230. In one embodiment, the contact structure may be deposited using photolithographic patterning and masking techniques after revealing the target area of end portions 230b, followed by deposition of a conductive material over end portions 230b.

Figure 3A:
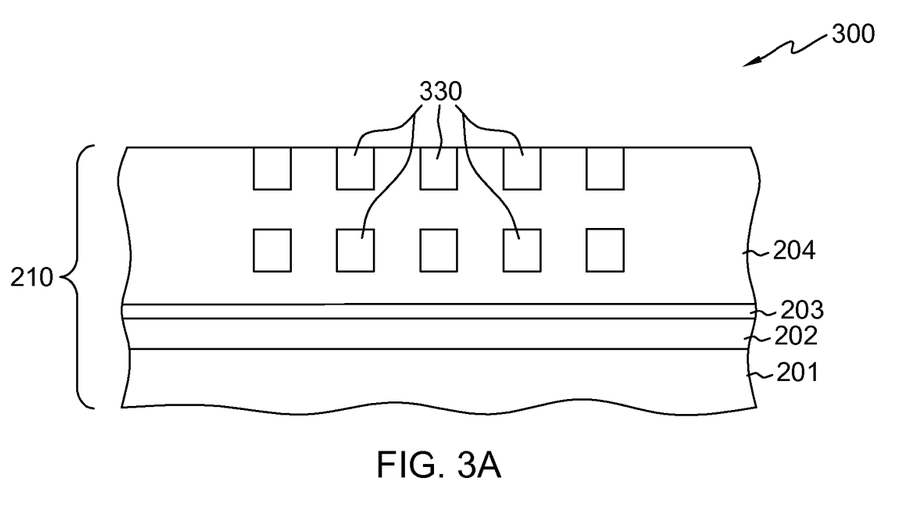
FIG. 3A is a cross-sectional elevational view of a structure found in a capacitor structure fabrication process, in accordance with one or more aspects of the present invention.

By way of summary, FIGS. 3A-3E illustrate additional embodiments of capacitor structures and fabrication methods thereof. Specifically, FIG. 3A is a cross-sectional elevational view of a structure 300 found in a capacitor structure fabrication process, in accordance with one or more aspects of the present invention. In the illustrated embodiment, first electrodes 330 having two stacked layers are illustrated. For example, in one embodiment, two layers may be formed by starting from structure 200 FIG. 2C and employing processing steps as described with respect to FIGS. 2A-2B.

Figure 3B:
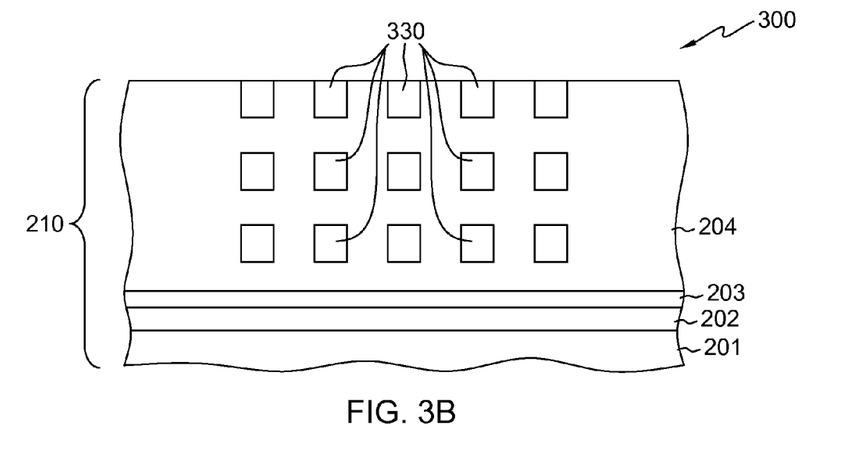
FIG. 3B depicts the structure of FIG. 3A, after stacking another layer of first electrodes over an insulator layer, in accordance with one or more aspects of the present invention.

FIG. 3B depicts structure 300, after stacking another layer of first electrodes 330 over the first layer, in accordance with one or more aspects of the present invention. In the illustrated embodiment, first electrodes 330 have three layers. In one or more embodiments, first electrodes 330 may include 4, 5, or more layers, depending on the target capacitance, dimensions, and other parameters required of a capacitor structure.

Figure 3C:
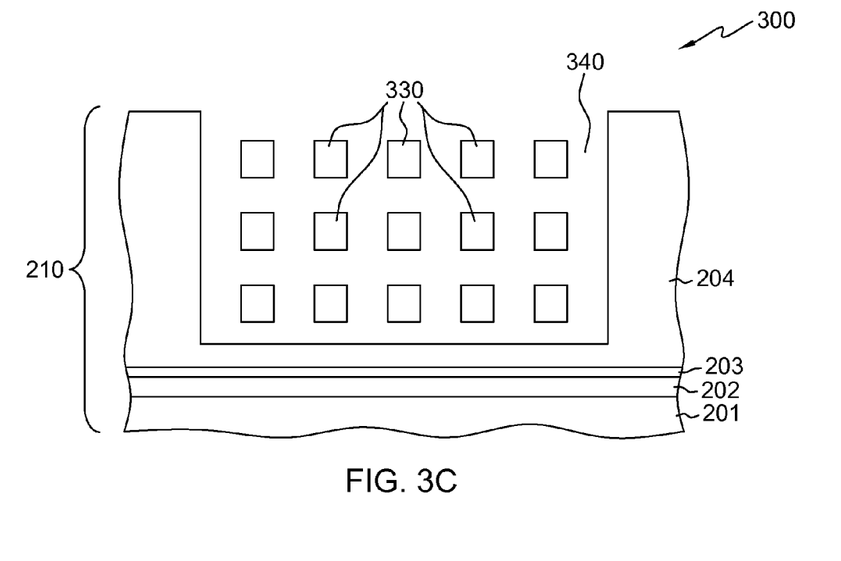
FIG. 3C depicts the structure of FIG. 3B, after removing portions of the insulator layer to form a cavity and expose portions of the first electrodes, in accordance with one or more aspects of the present invention.

FIG. 3C depicts structure 300, after removing portions of insulator layer 204 to form a cavity 340 and expose portions of first electrodes 330, in accordance with one or more aspects of the present invention. For example, etching may be employed to etch around and below each of first electrodes 330. Such etching may be selective to the material of insulator layer 204, and may include isotropic and anisotropic etching to reveal cavity 340.

Figure 3D:
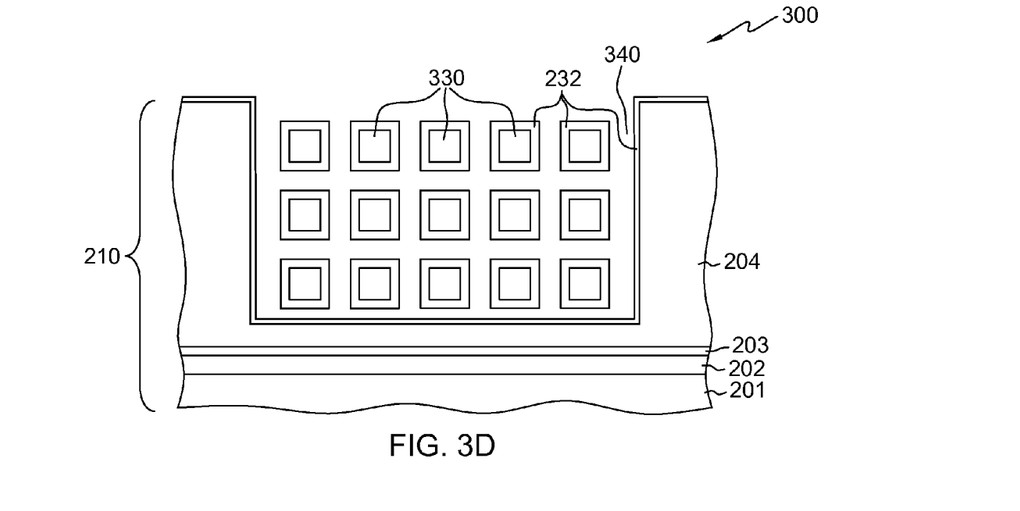
FIG. 3D depicts the structure of FIG. 3C, after covering the exposed portions of the first electrodes with a dielectric material, in accordance with one or more aspects of the present invention.

FIG. 3D depicts structure 300, after covering the exposed portions of first electrodes 330 with a dielectric material 232, in accordance with one or more aspects of the present invention. In one example, a material deposition process for the dielectric and liner materials may include deposition in the vapor phase in order to reach lower surfaces of first electrodes 330.

Figure 3E:
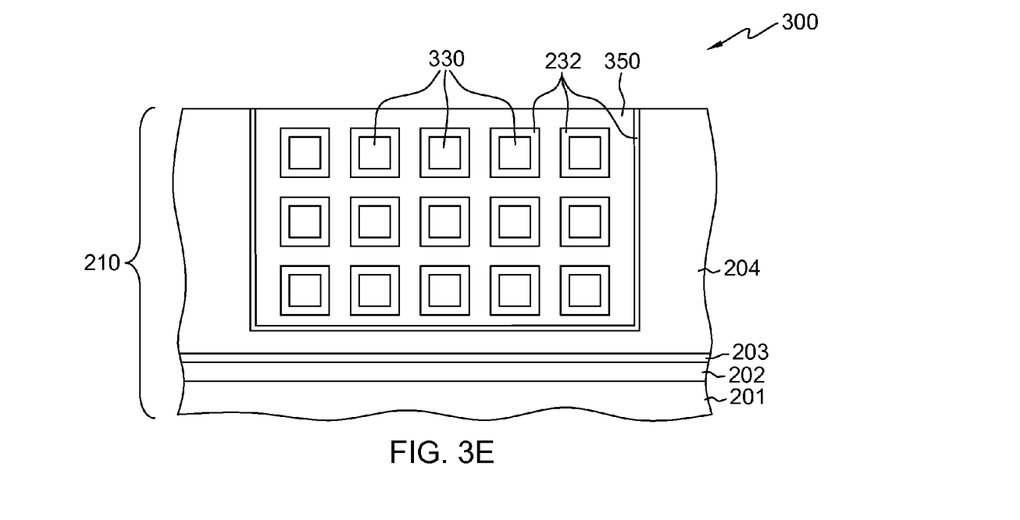
FIG. 3E depicts the structure of FIG. 3D, after forming a second electrode of the capacitor structure, in accordance with one or more aspects of the present invention.

FIG. 3E depicts structure 300, after forming a second electrode 350 of the capacitor structure, in accordance with one or more aspects of the present invention. For example, second electrode may be formed using a growth process tuned to fill completey fill cavity 340 (FIG. 3E). In another example, cavity 340 may not be completely filled, but even partial surrounding of first electrodes by second electrodes will achieve a working capacitor.

Figure 4:
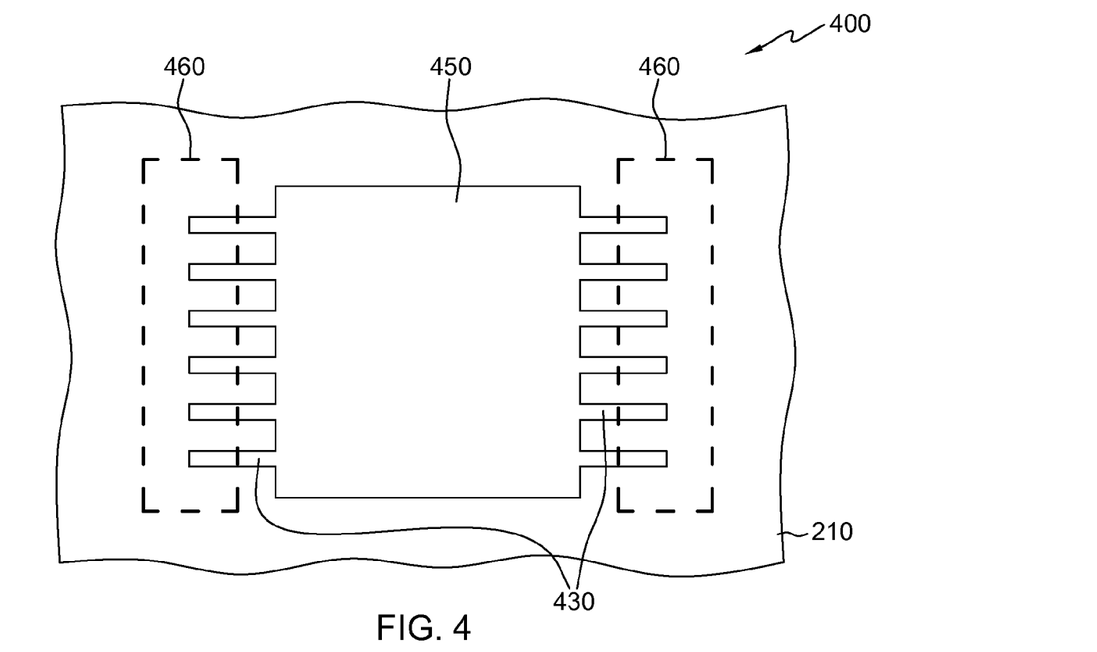
FIG. 4 is a plan view of one embodiment of a capacitor structure, in accordance with one or more aspects of the present invention.

FIG. 4 is a plan view of one embodiment of a capacitor structure 400, in accordance with one or more aspects of the present invention. In the illustrated embodiment, first electrodes 430 are revealed on either end of structure 400, in preparation for formation of first electrode contact structures 460. In addition, second electrode 450 has been disposed over middle portions of first electrodes 430.

Figure 5:
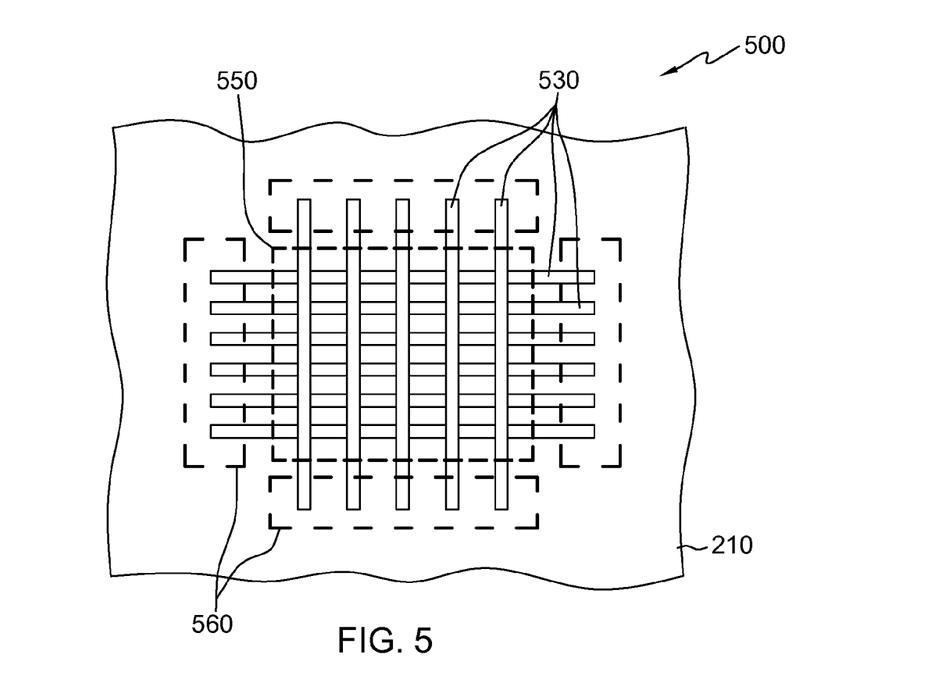
FIG. 5 is a plan view of one embodiment of a capacitor structure, in accordance with one or more aspects of the present invention.

FIG. 5 is a plan view of one embodiment of a capacitor structure 500, in accordance with one or more aspects of the present invention. In the illustrated embodiment, first electrodes 530 include some electrodes which are disposed perpendicular to other electrodes. In such a case, first electrodes 530 are revealed on all four sides, and a first electrode contact structure 560 may be disposed around all four sides. In addition, a second electrode 550 may be disposed over middle portions of first electrodes 530.

By way of further examples, in other embodiments, the techniques disclosed herein may be used to form integrated devices with inductive and capacitive portions. For instance, an integrated device may include: a conductive coil, the conductive coil including an inductive portion of the integrated device; a dielectric material, the dielectric material covering exposed portions of the conductive coil; and an electrode, the electrode being disposed at least partially around the dielectric covered portions of the conductive coil and being physically separated from the conductive coil by the dielectric material, where a capacitive portion of the integrated device includes the electrode, the dielectric material, and the conductive coil.

In one embodiment, the integrated device further includes another electrode, the other electrode being in electrical contact with at least one further portion of the conductive coil. In another embodiment, the integrated device further includes a liner material, the liner material being disposed over the dielectric covered portions of the conductive coil and inhibiting damage to the dielectric material from the electrode. In a further embodiment, the conductive coil is aligned with an axis substantially parallel to an upper surface of a substrate.

In one embodiment, the conductive coil is aligned with an axis substantially perpendicular to an upper surface of a substrate. In another embodiment, the integrated device further includes at least one interconnect structure, the at least one interconnect structure connecting the inductive portion and the capacitive portion of the integrated device in a series electrical connection. In another embodiment, the integrated device further includes at least one interconnect structure, the at least one interconnect structure connecting the inductive portion and the capacitive portion of the integrated device in a parallel electrical connection. In a further embodiment, the conductive coil is substantially coplanar with an upper surface of a substrate.

In another implementation, for fabricating an integrated device having an inductive portion and a capacitive portion includes, for instance: providing a conductive coil at least partially within a substrate, where the inductive portion of the integrated device includes the conductive coil; covering exposed portions of the conductive coil with a dielectric material; and forming the electrode of the integrated device at least partially around the dielectric covered portions of the conductive coil, the electrode being physically separated from the conductive coil by the dielectric material, where the capacitive portion of the integrated device includes the electrode, the dielectric material, and the conductive coil.

In another embodiment, the fabricating further includes exposing at least one further portion of the conductive coil; and providing another electrode in electrical contact with the at least one exposed further portion of the conductive coil. In a further embodiment, the providing includes forming the conductive coil within a cavity of the substrate, where the exposed portions of the conductive coil are exposed within the cavity of the substrate. In such a case, for example, the forming may include filling the cavity of the substrate with the electrode. In another example, the providing 110 includes removing portions of the substrate to form the cavity and expose the exposed portions of the conductive coil.

In one embodiment, the providing includes forming trenches in the substrate; forming a conductive coil within the trenches of the substrate; and etching the substrate to expose the exposed portions of the conductive coil. In such a case, the etching may include laterally etching the substrate to facilitate exposing lower portions of the conductive coil.

In another embodiment, the fabricating further includes disposing, after the covering, a liner material over the dielectric covered portions of the conductive coil, the liner material inhibiting damage to the dielectric material during the forming. In a further embodiment, the providing includes aligning the conductive coil with an axis substantially parallel to an upper surface of the substrate.

In one embodiment, the providing includes aligning the conductive coil with an axis substantially perpendicular to an upper surface of the substrate. In another embodiment, the fabricating further includes forming at least one interconnect structure, where the at least one interconnect structure connects the inductive portion and the capacitive portion of the integrated device in a series electrical connection. In another embodiment, the fabricating further includes forming at least one interconnect, where the at least one interconnect structure connects the inductive portion and the capacitive portion of the integrated device in a parallel electrical connection. In a further embodiment, the forming includes at least partially embedding the conductive coil within the electrode of the integrated device.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
fabricating a capacitor structure having first electrodes at least partially embedded within a second electrode, the fabricating comprising:
providing the first electrodes at least partially within an insulator layer above a substrate, the first electrodes comprising exposed portions;
covering exposed portions of the first electrodes with a dielectric material;
forming the second electrode at least partially around the dielectric covered portions of the first electrodes, the second electrode being physically separated from the first electrodes by the dielectric material; and
wherein the providing comprises forming the first electrodes within a cavity of the insulator layer, wherein the exposed portions of the first electrodes are exposed within the cavity of the insulator layer.

2. The method of claim 1, further comprising:
exposing further portions of the first electrodes; and
providing a contact structure in electrical contact with the further exposed portions of the first electrodes.

3. The method of claim 1, wherein the providing comprises aligning the first electrodes to be substantially parallel and coplanar.

4. The method of claim 1, wherein the forming comprises filling the cavity of the insulator layer with the second electrode.

5. The method of claim 1, wherein the providing comprises removing portions of the insulator layer to form the cavity and expose the exposed portions of the first electrodes.

6. The method of claim 1, wherein the providing comprises:
forming trenches in the insulator layer;
forming the first electrodes within the trenches of the insulator layer; and
etching the insulator layer to expose the exposed portions of the first electrodes.

7. The method of claim 6, wherein the etching comprises laterally etching the insulator layer to facilitate exposing lower portions of the first electrodes.

8. The method of claim 1, further comprising disposing, after the covering, a liner material over the dielectric covered portions of the first electrodes, the liner material inhibiting damage to the dielectric material during the forming.

9. The method of claim 1, wherein the providing comprises aligning some of the first electrodes substantially parallel to a first direction and other of the first electrodes substantially parallel to a second direction, wherein the first and second directions are different directions.

10. The method of claim 1, wherein the providing comprises stacking the first electrodes in multiple layers over the insulator layer.

11. The method of claim 1, wherein the providing comprises spacing apart the first electrodes with a characteristic spacing.

* * * * *